(12) United States Patent
Katoh et al.

(10) Patent No.: US 7,581,311 B2
(45) Date of Patent: Sep. 1, 2009

(54) METHOD FOR MANUFACTURING A DIELECTRIC ELEMENT

(75) Inventors: Tomohiko Katoh, Tokyo (JP); Kenji Horino, Tokyo (JP)

(73) Assignee: TDK Corporation, Tokyo (JP)

( * ) Notice: Subject to any disclaimer, the term of this patent is extended or adjusted under 35 U.S.C. 154(b) by 225 days.

(21) Appl. No.: 11/602,981

(22) Filed: Nov. 22, 2006

(65) Prior Publication Data

US 2007/0236866 A1    Oct. 11, 2007

(30) Foreign Application Priority Data

Nov. 30, 2005   (JP) ............................. P2005-346136

(51) Int. Cl.
*H05K 3/20*   (2006.01)
(52) U.S. Cl. ................. 29/831; 29/25.02; 29/25.42; 427/79
(58) Field of Classification Search ............... 29/25.02, 29/25.03, 831, 846, 851, 25.41, 25.42; 257/295, 257/310, 766, 762; 361/313; 427/79; 438/239, 438/240, 781
See application file for complete search history.

(56) References Cited

U.S. PATENT DOCUMENTS 5,851,841 A * 12/1998 Ushikubo et al. ........... 438/240
6,198,119 B1 * 3/2001 Nabatame et al. ........... 257/295

FOREIGN PATENT DOCUMENTS

JP    A-08-055967    2/1996
JP    B2-3188179    5/2001

* cited by examiner

*Primary Examiner*—Donghai D. Nguyen
(74) *Attorney, Agent, or Firm*—Oliff & Berridge, Plc.

(57) ABSTRACT

A method for manufacturing a dielectric element including the steps of: preparing a lower electrode; forming a dielectric on the lower electrode to fabricate a first laminated structure; annealing the first laminated structure; forming an upper electrode on a dielectric film to fabricate a second laminated structure; and annealing the second laminated structure under a reduced pressure atmosphere at a temperature of 150° C. or higher.

14 Claims, 5 Drawing Sheets

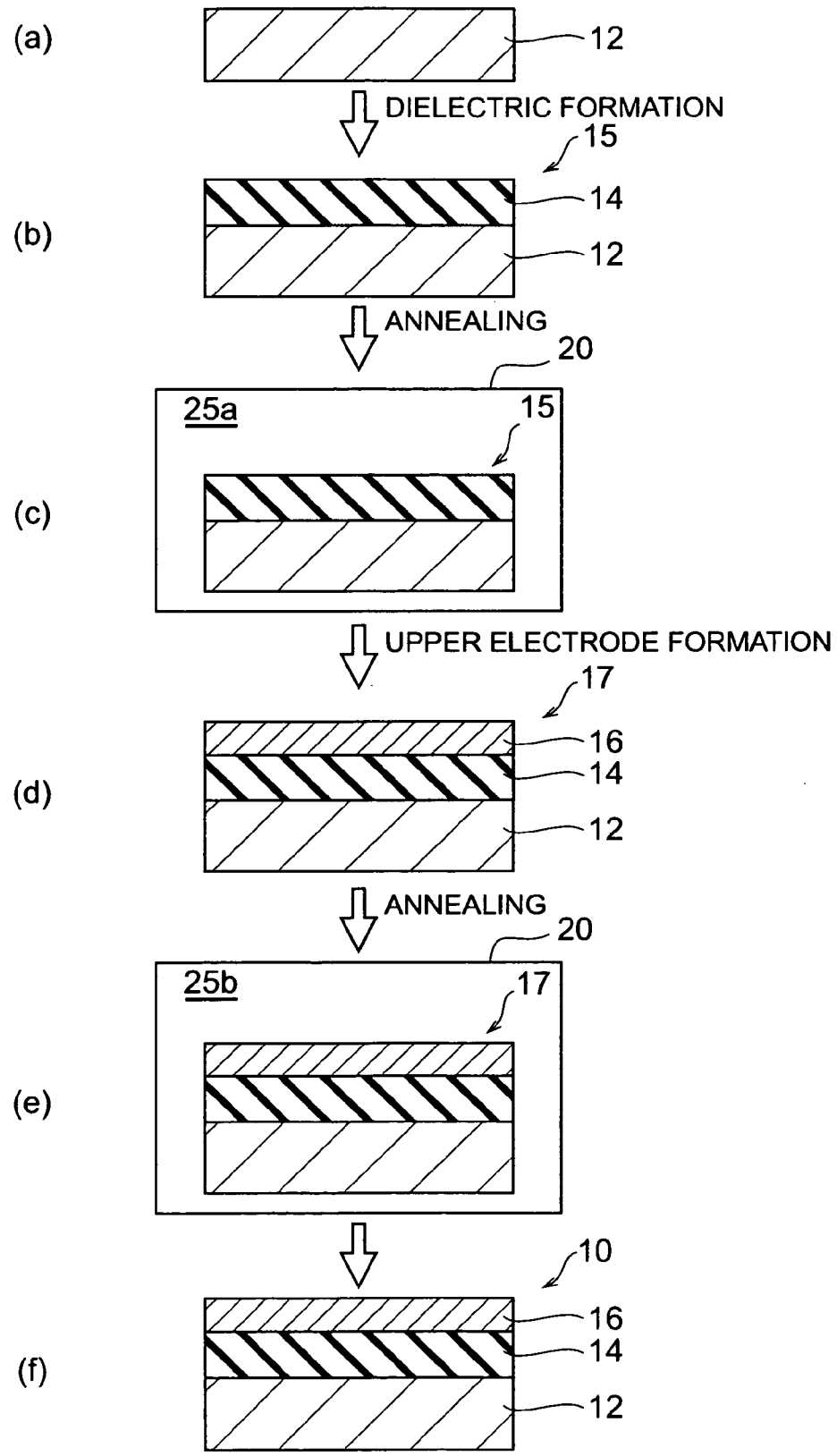

Fig.2

UPPER ELECTRODE: Cu    DIELECTRIC FILM: BST(MOD METHOD)

| | NORMAL PRESSURE | 133Pa | $10^{-1}$Pa | $10^{-2}$Pa | $10^{-4}$Pa |
|---|---|---|---|---|---|
| WITHOUT ANNEALING | 1030<br>$8.1 \times 10^{-6}$ | - | - | - | - |
| 100°C | 1030<br>$8.1 \times 10^{-6}$ | 1020<br>$7.9 \times 10^{-6}$ | 1020<br>$8.0 \times 10^{-6}$ | 1030<br>$7.9 \times 10^{-6}$ | 1030<br>$8.1 \times 10^{-6}$ |
| 150°C | OXIDATION | 1030<br>$4.0 \times 10^{-7}$ | 1030<br>$3.7 \times 10^{-7}$ | 1035<br>$2.8 \times 10^{-7}$ | 1035<br>$3.0 \times 10^{-7}$ |
| 250°C | - | 1030<br>$3.7 \times 10^{-7}$ | 1035<br>$3.6 \times 10^{-7}$ | 1050<br>$2.8 \times 10^{-7}$ | 1030<br>$3.1 \times 10^{-7}$ |
| 350°C | - | 980<br>$3.3 \times 10^{-7}$ | 1025<br>$3.1 \times 10^{-7}$ | 1055<br>$3.1 \times 10^{-7}$ | EVAPORATION |
| 450°C | - | OXIDATION | 900<br>$3.2 \times 10^{-7}$ | 960<br>$3.0 \times 10^{-7}$ | - |
| 500°C | - | - | EVAPORATION | EVAPORATION | |

Fig.3

UPPER ELECTRODE: Ni    DIELECTRIC FILM: BST(MOD METHOD)

| | NORMAL PRESSURE | 133Pa | $10^{-1}$Pa | $10^{-2}$Pa | $10^{-4}$Pa |
|---|---|---|---|---|---|
| WITHOUT ANNEALING | 1025<br>$8.3 \times 10^{-6}$ | - | - | - | - |
| 100°C | 1030<br>$7.6 \times 10^{-6}$ | 1025<br>$7.4 \times 10^{-6}$ | 1030<br>$8.0 \times 10^{-6}$ | 1030<br>$7.8 \times 10^{-6}$ | 1025<br>$8.1 \times 10^{-6}$ |
| 150°C | 1030<br>$8 \times 10^{-6}$ | 1030<br>$3.5 \times 10^{-7}$ | 1030<br>$3.4 \times 10^{-7}$ | 1035<br>$2.8 \times 10^{-7}$ | 1035<br>$4.3 \times 10^{-7}$ |
| 250°C | 1030<br>$8 \times 10^{-6}$ | 1025<br>$4.2 \times 10^{-7}$ | 1035<br>$4.1 \times 10^{-7}$ | 1040<br>$2.8 \times 10^{-7}$ | 1035<br>$3.1 \times 10^{-7}$ |
| 350°C | OXIDATION | 1010<br>$3.9 \times 10^{-7}$ | 1035<br>$2.6 \times 10^{-7}$ | 1035<br>$3.0 \times 10^{-7}$ | 1030<br>$3.4 \times 10^{-7}$ |
| 450°C | - | 980<br>$3.2 \times 10^{-7}$ | 990<br>$3.5 \times 10^{-7}$ | 1000<br>$3.3 \times 10^{-7}$ | 965<br>$3.3 \times 10^{-7}$ |
| 500°C | - | 890<br>$9.2 \times 10^{-6}$ | 920<br>$1.7 \times 10^{-5}$ | 930<br>$3.1 \times 10^{-5}$ | 915<br>$1.8 \times 10^{-5}$ |

Fig.4

UPPER ELECTRODE: Al    DIELECTRIC FILM: BST(MOD METHOD)

| | NORMAL PRESSURE | 133Pa | $10^{-1}$Pa | $10^{-2}$Pa | $10^{-4}$Pa |
|---|---|---|---|---|---|
| WITHOUT ANNEALING | 1020<br>$7.8 \times 10^{-6}$ | - | - | - | - |
| 100°C | 1020<br>$7.8 \times 10^{-6}$ | 1020<br>$8.2 \times 10^{-6}$ | 1025<br>$8.1 \times 10^{-6}$ | 1030<br>$8.5 \times 10^{-6}$ | 1020<br>$7.4 \times 10^{-6}$ |
| 150°C | OXIDATION | 1010<br>$4.1 \times 10^{-7}$ | 1030<br>$3.5 \times 10^{-7}$ | 1035<br>$3.3 \times 10^{-7}$ | 1030<br>$3.5 \times 10^{-7}$ |
| 300°C | - | OXIDATION | 990<br>$4.2 \times 10^{-7}$ | 1010<br>$3.2 \times 10^{-7}$ | 1015<br>$3.8 \times 10^{-7}$ |
| 400°C | - | - | EVAPORATION | EVAPORATION | EVAPORATION |

Fig.5

UPPER ELECTRODE: Ag    DIELECTRIC FILM: BST(MOD METHOD)

| | NORMAL PRESSURE | 133Pa | $10^{-1}$Pa | $10^{-2}$Pa | $10^{-4}$Pa |
|---|---|---|---|---|---|
| WITHOUT ANNEALING | 1020<br>$8.5 \times 10^{-6}$ | - | - | - | - |
| 100°C | 1010<br>$8.2 \times 10^{-6}$ | 1015<br>$8.2 \times 10^{-6}$ | 1025<br>$7.8 \times 10^{-6}$ | 1030<br>$8.0 \times 10^{-6}$ | 1020<br>$7.4 \times 10^{-6}$ |
| 150°C | OXIDATION | 1010<br>$3.9 \times 10^{-7}$ | 1030<br>$4.2 \times 10^{-7}$ | 1035<br>$3.3 \times 10^{-7}$ | 1030<br>$3.6 \times 10^{-7}$ |
| 300°C | - | OXIDATION | 980<br>$3.7 \times 10^{-7}$ | 1020<br>$3.0 \times 10^{-7}$ | 1010<br>$4.0 \times 10^{-7}$ |
| 400°C | - | - | EVAPORATION | EVAPORATION | EVAPORATION |

Fig.6

UPPER ELECTRODE: Cu    DIELECTRIC FILM: BST(SPUTTERING METHOD)

| | NORMAL PRESSURE | 133Pa | $10^{-1}$Pa | $10^{-2}$Pa | $10^{-4}$Pa |
|---|---|---|---|---|---|
| WITHOUT ANNEALING | 1980<br>$6.2 \times 10^{-6}$ | - | - | - | - |
| 100°C | 1980<br>$6.2 \times 10^{-6}$ | 2005<br>$4.2 \times 10^{-6}$ | 2005<br>$3.7 \times 10^{-6}$ | 2010<br>$3.2 \times 10^{-6}$ | 2000<br>$4.0 \times 10^{-6}$ |
| 150°C | OXIDATION | 2015<br>$2.8 \times 10^{-7}$ | 2020<br>$1.5 \times 10^{-7}$ | 2030<br>$1.2 \times 10^{-7}$ | 2010<br>$1.6 \times 10^{-7}$ |
| 250°C | - | 2030<br>$2.2 \times 10^{-7}$ | 2040<br>$1.6 \times 10^{-7}$ | 2060<br>$1.4 \times 10^{-7}$ | 2040<br>$1.3 \times 10^{-7}$ |
| 350°C | - | 2040<br>$1.8 \times 10^{-7}$ | 2060<br>$1.4 \times 10^{-7}$ | 2100<br>$1.3 \times 10^{-7}$ | EVAPORATION |
| 450°C | - | OXIDATION | 2050<br>$1.4 \times 10^{-7}$ | 2080<br>$1.3 \times 10^{-7}$ | - |
| 500°C | - | - | EVAPORATION | EVAPORATION | |

Fig.7

UPPER ELECTRODE: Ni    DIELECTRIC FILM: BST(SPUTTERING METHOD)

| | NORMAL PRESSURE | 133Pa | $10^{-1}$Pa | $10^{-2}$Pa | $10^{-4}$Pa |
|---|---|---|---|---|---|
| WITHOUT ANNEALING | 1980<br>$6.2 \times 10^{-6}$ | - | - | - | - |
| 100°C | 1980<br>$6.2 \times 10^{-6}$ | 2000<br>$4.2 \times 10^{-6}$ | 1995<br>$3.7 \times 10^{-6}$ | 2000<br>$3.2 \times 10^{-6}$ | 1995<br>$4.0 \times 10^{-6}$ |
| 150°C | 1980<br>$6.2 \times 10^{-6}$ | 1995<br>$2.4 \times 10^{-7}$ | 1995<br>$2.0 \times 10^{-7}$ | 2005<br>$1.8 \times 10^{-7}$ | 2000<br>$1.5 \times 10^{-7}$ |
| 250°C | 1980<br>$6.2 \times 10^{-6}$ | 2000<br>$2.1 \times 10^{-7}$ | 2000<br>$1.8 \times 10^{-7}$ | 1995<br>$1.6 \times 10^{-7}$ | 1995<br>$1.7 \times 10^{-7}$ |
| 350°C | OXIDATION | 1990<br>$2.0 \times 10^{-7}$ | 1995<br>$1.7 \times 10^{-7}$ | 1990<br>$1.9 \times 10^{-7}$ | 1980<br>$2.5 \times 10^{-7}$ |
| 450°C | | 1870<br>$2.0 \times 10^{-7}$ | 1880<br>$1.9 \times 10^{-7}$ | 1900<br>$1.6 \times 10^{-7}$ | 1910<br>$2.3 \times 10^{-7}$ |
| 500°C | - | 1540<br>$4.6 \times 10^{-5}$ | 1510<br>$5.5 \times 10^{-5}$ | 1500<br>$3.8 \times 10^{-5}$ | EVAPORATION |

Fig.8

UPPER ELECTRODE: Al     DIELECTRIC FILM: BST(SPUTTERING METHOD)

| | NORMAL PRESSURE | 133Pa | $10^{-1}$Pa | $10^{-2}$Pa | $10^{-4}$Pa |
|---|---|---|---|---|---|
| WITHOUT ANNEALING | 1980<br>$6.2 \times 10^{-6}$ | - | - | - | - |
| 100°C | 1980<br>$6.2 \times 10^{-6}$ | 2000<br>$4.0 \times 10^{-6}$ | 2010<br>$3.5 \times 10^{-6}$ | 2005<br>$3.4 \times 10^{-6}$ | 1995<br>$3.8 \times 10^{-6}$ |
| 150°C | OXIDATION | 2005<br>$2.7 \times 10^{-7}$ | 2010<br>$1.8 \times 10^{-7}$ | 2000<br>$1.3 \times 10^{-7}$ | 1995<br>$1.5 \times 10^{-7}$ |
| 300°C | - | OXIDATION | 1990<br>$1.9 \times 10^{-7}$ | 2000<br>$1.2 \times 10^{-7}$ | 1990<br>$1.4 \times 10^{-7}$ |
| 400°C | - | - | EVAPORATION | EVAPORATION | EVAPORATION |

Fig.9

UPPER ELECTRODE: Ag     DIELECTRIC FILM: BST(SPUTTERING METHOD)

| | NORMAL PRESSURE | 133Pa | $10^{-1}$Pa | $10^{-2}$Pa | $10^{-4}$Pa |
|---|---|---|---|---|---|
| WITHOUT ANNEALING | 1980<br>$6.2 \times 10^{-6}$ | - | - | - | - |
| 100°C | 1980<br>$6.2 \times 10^{-6}$ | 1990<br>$4.1 \times 10^{-6}$ | 1995<br>$3.6 \times 10^{-6}$ | 2005<br>$3.4 \times 10^{-6}$ | 2000<br>$3.5 \times 10^{-6}$ |
| 150°C | OXIDATION | 2000<br>$2.9 \times 10^{-7}$ | 2005<br>$1.7 \times 10^{-7}$ | 2005<br>$1.5 \times 10^{-7}$ | 2000<br>$1.8 \times 10^{-7}$ |
| 300°C | - | OXIDATION | 2000<br>$2.0 \times 10^{-7}$ | 2000<br>$1.5 \times 10^{-7}$ | 1995<br>$1.6 \times 10^{-7}$ |
| 400°C | - | - | EVAPORATION | EVAPORATION | EVAPORATION |

METHOD FOR MANUFACTURING A DIELECTRIC ELEMENT

BACKGROUND OF THE INVENTION

1. Field of the Invention

The present invention relates to a dielectric element such as a thin film capacitor, and a method for manufacturing the same.

2. Related Background Art

A dielectric element having a structure in which a dielectric is provided on an electrode is generally known. A typical example of a dielectric element is a thin film capacitor. Japanese Patent Application Laid-Open No. Hei 8-55967 discloses manufacture of a dielectric element having a low leak current density by annealing a laminated structure under an oxidation atmosphere at 500° C. or higher after sequentially laminating a lower electrode, a dielectric film, and an upper electrode on a substrate. Further, Japanese Patent No. 3188179 discloses a method for heating the laminated structure under an atmosphere at a pressure of 1 atm or lower after sequentially laminating the lower electrode, the dielectric film, and the upper electrode on the substrate.

The method in Japanese Patent Application Laid-Open No. Hei 8-55967 uses Pt as a material of the upper electrode and the lower electrode because the annealing temperature is comparatively high. However, since Pt is expensive, it is preferable if an inexpensive material having a high conductivity such as Cu, Ni, Al, or Ag whose oxidation temperature is low can be used for an electrode of a dielectric element. These metals, however, have a low oxidation temperature, and therefore, it is difficult to use them in the method in Japanese Patent Application Laid-Open No. Hei 8-55967, in which annealing is performed at comparatively high temperatures. It is possible to prevent oxidation if the annealing temperature is reduced, however, it is no longer possible, on the contrary, to sufficiently reduce the leak current density.

SUMMARY OF THE INVENTION

Therefore, an object of the present invention is to provide a method for manufacturing a dielectric element capable of using a material having a low oxidation temperature for an electrode and of sufficiently reducing a leak current density, and a dielectric element having a high dielectric constant and a low leak current density that can be manufactured by this method.

One aspect of the present invention relates to a method for manufacturing a dielectric element. This method includes the steps of preparing a lower electrode, forming a dielectric on the lower electrode to fabricate a first laminated layer structure, annealing the first laminated structure, forming an upper electrode on the dielectric to fabricate a second laminated structure, and annealing the second laminated structure at a temperature of 150° C. or higher under a reduced pressure atmosphere. It is preferable to anneal the second laminated structure at a temperature of 450° C. or lower in order to prevent evaporation of the lower electrode and the upper electrode. Further, it is preferable for the pressure of the reduced pressure atmosphere to be 133 Pa or lower.

By annealing the second laminated structure under a reduced pressure atmosphere, it is possible to raise the oxidation temperature of the electrode compared to the case of annealing under an atmosphere of 1 atm. Because of this, it is possible to anneal the second laminated structure at comparatively high temperatures without oxidizing the electrode even if a material having a low oxidation temperature is used for the electrode. Further, since the annealing temperature is 150° C. or higher, it is possible to sufficiently reduce the leak current density.

The upper electrode may be composed of one or more of Cu, Ni, Al, and Ag. Although these materials are oxidized at comparatively low temperatures, since the oxidation temperature is raised by annealing the second laminated structure under a decompressed atmosphere, it is possible to sufficiently reduce the leak current density of the dielectric element without oxidizing the upper electrode. Since Cu, Ni, Al, and Ag have comparatively high electric conductivities, it is possible to raise the electric characteristics of the dielectric element by using these for the upper electrode. Further, since Cu, Ni, Al, and Ag are comparatively inexpensive, the cost of manufacturing the dielectric element can be suppressed.

As the dielectric, an oxide can be used. Preferable examples of the oxide dielectric include a perovskite type oxide having a composition represented by a general chemical formula $ABO_3$. This oxide is composed by including one or more elements of Ba, Sr, Ca, Pb, Ti, Zr, and Hf. Such perovskite type oxides include, for example, $BaTiO_3$, $SrTiO_3$, $(BaSr)TiO_3$, $(BaSr)(TiZr)O_3$, and $BaTiZrO_3$. The dielectric may include one or more of these oxides.

When the upper electrode is composed of Cu or Ni, it is preferable to anneal the second laminated structure at 450° C. or lower in the step of annealing the second laminated structure. By suppressing the annealing temperature to 450° C. or lower, it becomes easier to prevent evaporation of the upper electrode even under a reduced pressure atmosphere.

When the upper electrode is composed of Al or Ag, it is preferable to anneal the second laminated structure at 300° C. or lower in the step of annealing the second laminated structure. By suppressing the annealing temperature to 300° C. or lower, it becomes easier to prevent evaporation of the upper electrode even under a reduced pressure atmosphere.

In the step of annealing the first laminated structure, it may also be possible to anneal the first laminated structure under the reduced pressure atmosphere, the reducing atmosphere or the reduced pressure reducing atmosphere. By using these atmospheres, the lower electrode becomes difficult to oxidize. As a result, it is made possible to use a material, such as Cu, Ni, Al, and Ag, which has a high conductivity and is inexpensive, however, the oxidation temperature of which is low for the lower electrode.

The lower electrode may be composed of one or more of Cu, Ni, Al, and Ag. By annealing the second laminated structure under a reduced pressure atmosphere, the oxidation temperatures of Cu, Ni, Al, and Ag are raised, and therefore, it is possible to sufficiently reduce the leak current density of the dielectric element without oxidizing the lower electrode. Further, since Cu, Ni, Al, and Ag have high conductivities and are inexpensive, by using these for the upper electrode it is possible to raise the electric characteristics of the dielectric element and suppress the cost of manufacturing.

The lower electrode may be a metallic foil. Since the metallic foil is self-supportable, it can be used as a substrate for supporting a dielectric. Consequently, it is not necessary to prepare a substrate separately from the lower electrode.

Another aspect of the present invention relates to a dielectric element comprising a lower electrode, a dielectric film provided on the lower electrode, and an upper electrode provided on the dielectric film. The upper electrode of the dielectric element is composed of one or more of Cu, Ni, Al, and Ag. Since Cu, Ni, Al, and Ag have high conductivities and are inexpensive, by using these for the upper electrode, it is possible to raise the electric characteristics of the dielectric element and suppress the cost of manufacturing. The dielectric film has a dielectric constant of 900 or greater. The leak current density of the dielectric element is $1\times10^{-6}$ A/cm$^2$ or less. According to the present invention, it is possible to manufacture a dielectric element having a high dielectric constant and a low leak current density.

In this dielectric element, the dielectric film is composed of an oxide including one or more of Ba, Sr, Ca, Ti, Zr, and Hf, and the lower electrode may be composed of one or more of Cu, Ni, Al, and Ag. Since Cu, Ni, Al, and Ag have high conductivities and are inexpensive, by using these for the upper electrode, it is possible to raise the electric characteristics of the dielectric element and suppress the cost of manufacturing.

BRIEF DESCRIPTION OF THE DRAWINGS

FIG. 1 is a process drawing showing a manufacturing method of a dielectric element according to an embodiment.

FIG. 2 is a diagram showing the electric characteristics of a dielectric element having a Cu upper electrode and a dielectric film formed by the MOD method.

FIG. 3 is a diagram showing the electric characteristics of a dielectric element having a Ni upper electrode and a dielectric film formed by the MOD method.

FIG. 4 is a diagram showing the electric characteristics of a dielectric element having an Al upper electrode and a dielectric film formed by the MOD method.

FIG. 5 is a diagram showing the electric characteristics of a dielectric element having an Ag upper electrode and a dielectric film formed by the MOD method.

FIG. 6 is a diagram showing the electric characteristics of a dielectric element having a Cu upper electrode and a dielectric film formed by the sputtering method.

FIG. 7 is a diagram showing the electric characteristics of a dielectric element having a Ni upper electrode and a dielectric film formed by the sputtering method.

FIG. 8 is a diagram showing the electric characteristics of a dielectric element having an Al upper electrode and a dielectric film formed by the sputtering method.

FIG. 9 is a diagram showing the electric characteristics of a dielectric element having an Ag upper electrode and a dielectric film formed by the sputtering method.

DESCRIPTION OF THE PREFERRED EMBODIMENTS

Embodiments of the present invention will be described below in detail with reference to accompanied drawings. In the description of drawings, the same symbols are attached to the same components and the duplicated description will be omitted.

FIG. 1 is a process drawing showing a manufacturing method of a dielectric element according to an embodiment. As shown in FIG. 1(a), a metallic foil is prepared first as a lower electrode 12. The metallic foil is self-supportable and therefore it can be used as a substrate for supporting a dielectric film 14 and an upper electrode 16 to be described later.

Next, a first laminated structure 15 is fabricated by forming the dielectric film 14 on the lower electrode 12 (refer to FIG. 1(b)). The dielectric film 14 can be formed by an arbitrary method such as a chemical solution method and a sputtering method. An example of the chemical solution method is a metal organic decomposition (MOD) method.

Subsequently, the first laminated structure 15 is annealed (refer to FIG. 1(c)). Specifically, the first laminated structure 15 is put into an annealing furnace 20 and heated for a predetermined period of time under a gas atmosphere 25a having a predetermined temperature. Due to this annealing process, the crystallinity of the dielectric element 14 is improved.

In order to prevent oxidation of the lower electrode 12, a reducing atmosphere, a reduced pressure atmosphere, or a reduced pressure reducing atmosphere is used as the atmosphere 25a. Here, the reduced pressure atmosphere means an atmosphere having a pressure lower than 1 atm (=101,325 Pa) and the reduced pressure reducing atmosphere means a reducing atmosphere having a pressure lower than 1 atm. By using the above-mentioned atmosphere, it is made possible to use a material, such as Cu, Ni, Al, and Ag, which has a high conductivity and is inexpensive, however, has a low oxidation temperature for the lower electrode 12. It is preferable for the temperature of the atmosphere 25a to be 300° C. or higher in order to sufficiently improve the crystallinity of the dielectric film 14.

Next, a second laminated structure 17 is fabricated by forming the upper electrode 16 on the dielectric film 14 (refer to FIG. 1(d)). The upper electrode 16 can be formed by an arbitrary method, such as the sputtering method and the electron beam deposition method.

Normally, when the upper electrode 16 is formed, damage is caused to the dielectric film 14 and a defect is caused to occur in the dielectric film 14. This defect will increase the leak current density between the lower electrode 12 and the upper electrode 16. Because of this, in order to remove the defect, the second laminated structure 17 is annealed (refer to FIG. 1(e)). Hereinafter, this annealing is referred to as "recovery annealing".

Specifically, the second laminated structure 17 is put into the annealing furnace 20 and heated for a predetermined period of time under a reduced pressure gas atmosphere 25b having a predetermined temperature. Due to this, a dielectric element 10 can be obtained (refer to FIG. 1(f)). The dielectric element 10 can be used as a thin film capacitor. Due to the recovery annealing, the defect caused to occur when the upper electrode 16 is formed is removed and the crystallinity of the dielectric film 14 is improved. Accompanying this, the leak current density of the dielectric element 10 is reduced.

In order to prevent oxidization of the lower electrode 12 and the upper electrode 16, a reduced pressure atmosphere is used as the atmosphere 25b. The reduced pressure atmosphere referred to here also includes a reduced pressure reducing atmosphere. In the present embodiment, the reduced pressure atmosphere 25b is obtained by reducing the pressure of the atmosphere to 133 Pa or less using a vacuum pump.

When a material, such as Cu, Ni, Al, and Ag, which has a high conductivity and is inexpensive, but has a low oxidation temperature is used for the upper electrode 16, the temperature of the atmosphere 25b (that is, the annealing temperature) is set to a comparatively low temperature at which the upper electrode 16 is not oxidized. Further, since the pressure of the atmosphere 25b is low, there is a possibility of evaporation of the electrode even if the temperature of the atmosphere is comparatively low. Consequently, also in order to prevent the evaporation of the electrode, the temperature of the atmosphere 25b should not be too high. On the other hand, the higher the temperature of the atmosphere 25b, the more the defect of the dielectric film 14 decreases in quantity and the more the leak current density decreases. Consequently, it is preferable to set the temperature of the atmosphere 25b to a temperature as high as possible in the temperature range in which the upper electrode 16 does not oxidize or evaporate.

The inventors of the present invention manufactured the dielectric element 10 having the upper electrode 16 composed of each of Cu, Ni, Al, and Ag under various conditions according to the method of the present embodiment in order to investigate the proper temperatures of the atmosphere 25b. Specifically, an Ni foil was prepared as the lower electrode 12 and BST, that is, barium strontium titanate (BaSr)TiO$_3$, having a thickness of 500 nm was formed on the Ni foil as the dielectric film 14 by the MOD method. The first laminated structure 15 thus obtained was annealed under the atmosphere 25a at 800° C. As the atmosphere 25a, a reduced pressure atmosphere obtained by reducing the pressure of atmosphere using a vacuum pump was used. Next, the upper electrode 16 having a thickness of 200 nm was formed on the dielectric film 14 by the sputtering method and the obtained second laminated structure 17 was annealed for 20 minutes under the reduced pressure atmosphere 25b at various temperatures. Further, for comparison with the present embodiment, the second laminated structure 17 was annealed for 20 minutes also under the atmosphere of 1 atm in pressure instead of the reduced pressure atmosphere 25b.

The inventors of the present invention measured the dielectric constant and the leak current density of the dielectric element thus manufactured. FIGS. 2 to 5 show the measurement result. The upper electrode 16 is composed of Cu in FIG. 2, Ni in FIG. 3, Al in FIG. 4, and Ag in FIG. 5. "Without annealing" on the left side in each figure indicates that annealing of the second laminated structure 17, that is, recovery annealing is not performed and the numeric values such as "100° C." represent the temperature of the reduced pressure atmosphere 25b used for recovery annealing. "Normal pressure" on the upper side in each figure indicates that recovery annealing is performed under the atmospheric atmosphere not reduced in pressure and numeric values such as "133 Pa" represent the pressure of the reduced pressure atmosphere 25b. Incidentally, the pressure of the atmospheric atmosphere is 1 atm (=101,325 Pa).

The numeric values in the upper row (1030 etc.) in the double-row layout inside of each figure represent the dielectric constant and those in the lower row ($8.1 \times 10^{-6}$ etc.) represent the leak current density (unit: A/cm$^2$). The dielectric constant was measured under the ambient temperature by applying an alternating current voltage having a frequency of 1 kHz and an amplitude of 1 V between the lower electrode 12 and the upper electrode 16 of the dielectric element 10. The leak current density is a value, which is the leak current value measured under the ambient temperature by applying a direct current voltage of 3 V between the lower electrode 12 and the upper electrode 16 of the dielectric element 10 divided by the electrode area. In addition, "oxidation" and "evaporation" in each figure show that the upper electrode 16 has oxidized and evaporated, respectively.

As shown in FIGS. 2 to 5, if recovery annealing is performed under a reduced pressure atmosphere, the upper electrode 16 can be prevented from oxidizing or evaporating even at higher temperatures than a case where recovery annealing is performed in the atmosphere not reduced in pressure. Further, each of FIGS. 2 to 5 indicates that the leak current density decreases drastically and falls to $1 \times 10^{-6}$ A/cm$^2$ or lower when the annealing temperature is 150° C. or higher under a reduced pressure atmosphere. Consequently, it is preferable for the annealing temperature to be 150° C. or higher.

It is possible to manufacture the dielectric element 10 without oxidation or evaporation of the upper electrode 16 by properly suppressing the annealing temperature under a reduced pressure atmosphere. The proper upper limit of the annealing temperature differs depending on the material of the upper electrode 16. As shown in FIG. 2, if the upper electrode 16 is composed of Cu, the upper electrode 16 evaporates when the annealing temperature is 500° C. or higher. When the annealing temperature is 450° C., the upper electrode 16 did not evaporate under pressures of $10^{-1}$ Pa and $10^{-2}$ Pa, and a high dielectric constant of 900 or greater was measured. Consequently, when the upper electrode 16 is composed of Cu, it is preferable to set the annealing temperature to 450° C. or lower.

When the upper electrode 16 is composed of Ni, the oxidation or evaporation of the upper electrode 16 was not observed under a reduced pressure atmosphere as shown in FIG. 3. However, while the leak current density is sufficiently low when the annealing temperature is not lower than 150° C. and not higher than 450° C., the leak current density is extremely large under a pressure of 133 Pa at 500° C. Consequently, it is preferable to set the annealing temperature to 450° C. or lower when the upper electrode 16 is composed of Ni.

When the upper electrode 16 is composed of Al, the upper electrode 16 evaporates when the annealing temperature is 400° C. as shown in FIG. 4. When the annealing temperature is 300° C., the upper electrode 16 did not evaporate under pressures of $10^{-1}$ Pa, $10^{-2}$ Pa, and $10^{-4}$ Pa and a high dielectric constant of 990 or greater was measured. Consequently, it is preferable to set the annealing temperature to 300° C. or lower when the upper electrode 16 is composed of Al.

When the upper electrode 16 is composed of Ag, the upper electrode 16 evaporates when the annealing temperature is 400° C. as shown in FIG. 5. When the annealing temperature is 300° C., the upper electrode 16 did not evaporate under pressures of $10^{-1}$ Pa, $10^{-2}$ Pa, and $10^{-4}$ Pa and a high dielectric constant of 980 or greater was measured. Consequently, it is preferable to set the annealing temperature to 300° C. or lower when the upper electrode 16 is composed of Ag.

Further, the inventors of the present invention manufactured the dielectric element 10 under various conditions by forming the dielectric film 14 composed of BST by the sputtering method instead of by the MOD method. Except for the manufacturing method of the dielectric film 14, the manufacturing conditions are the same as those of the dielectric element 10, the characteristics of which are shown in FIGS. 2 to 5. FIGS. 6 to 9 show the result of the measurement of the dielectric constant and the leak current density of the dielectric element thus manufactured. The upper electrode 16 is composed of Cu in FIG. 6, Ni in FIG. 7, Al in FIG. 8, and Ag in FIG. 9. As in FIGS. 2 to 5, the numeric values in the upper row (1980 etc.) in the double-row layout inside of each figure represent the dielectric constant and the numeric values in the lower row ($6 \times 10^{-6}$ Pa etc.) represent the leak current density (unit: A/cm$^2$). The measuring method of the dielectric constant and the leak current density is the same as that already described above.

As shown in FIGS. 6 to 9, also when the dielectric film 14 is formed by the sputtering method, by performing recovery annealing under a reduced pressure atmosphere, even at temperatures higher than when recovery annealing is performed in the atmosphere not reduced in pressure, the upper electrode 16 is prevented from oxidizing and evaporating. Further, each of FIGS. 6 to 9 shows that the leak current density becomes extremely low when the annealing temperature under a reduced pressure atmosphere becomes 150° C. or higher.

As shown in FIG. 6, when the upper electrode 16 is composed of Cu, if the annealing temperature is 500° C. or higher, the upper electrode 16 evaporates. When the annealing temperature is 450° C., the upper electrode 16 did not evaporate under pressures of $10^{-1}$ Pa and $10^{-2}$ Pa, and a high dielectric constant of 2,000 or greater and an extremely low leak current density of $1.4 \times 10^{-7}$ A/cm$^2$ were observed. Consequently, when the dielectric film 14 is manufactured by the sputtering method and the upper electrode 16 is composed of Cu, it is preferable to set the annealing temperature to 450° C. or lower.

When the upper electrode 16 is composed of Ni, as shown in FIG. 7, excluding the specimens processed under a pressure of $10^{-4}$ Pa, the oxidation or evaporation of the upper electrode 16 under a reduced pressure atmosphere was not observed. However, while the leak current density is sufficiently low when the annealing temperature is not lower than 150° C. and not higher than 450° C., the leak current density is extremely large under a pressure of 133 Pa at 500° C. Consequently, when the upper electrode 16 is composed of Ni, it is preferable to set the annealing temperature to 450° C. or lower.

When the upper electrode 16 is composed of Al, as shown in FIG. 8, when the annealing temperature is 400° C., the upper electrode 16 evaporates. When the annealing temperature was 300° C., the upper electrode 16 did not evaporate under pressures of $10^{-1}$ Pa, $10^{-2}$ Pa, and $10^{-4}$ Pa, and a high dielectric constant of 1,990 or greater and an extremely low leak current density of $1.2 \times 10^{-7}$ A/cm$^2$ were observed. Consequently, when the dielectric film 14 is manufactured by the sputtering method and the upper electrode 16 is composed of Al, it is preferable to set the annealing temperature to 300° C. or lower.

When the upper electrode 16 is composed of Ag, as shown in FIG. 9, when the annealing temperature is 400° C., the upper electrode 16 evaporates. When the annealing temperature was 300° C., the upper electrode 16 did not evaporate under pressures of $10^{-1}$ Pa, $10^{-2}$ Pa, and $10^{-4}$ Pa, and an extremely high dielectric constant of 1,995 and an extremely low leak current density of $1.5 \times 10^{-7}$ A/cm$^2$ were observed. Consequently, when the upper electrode 16 is composed of Ag, it is preferable to set the annealing temperature to 300° C. or lower.

As shown in FIGS. 2 to 9, it is possible to obtain a higher dielectric constant and a lower leak current density when the dielectric film 14 is formed by the sputtering method than when it is formed by the MOD method. This seems to be because the dielectric film 14 of higher quality can be formed by the sputtering method than by the MOD method.

As described above, by annealing the second laminated structure 17 under a reduced pressure atmosphere, it is possible to raise the oxidation temperature of the electrode material compared to the case where annealing is performed under the normal pressure atmosphere. Due to this, even if one or both of the upper electrode 16 and the lower electrode 12 are composed of a material having a low oxidation temperature, it is possible to anneal the second laminated structure at comparatively high temperatures without oxidizing the electrodes. When the annealing temperature is 150° C. or higher, it is possible to sufficiently reduce the leak current density of the dielectric element and also obtain a sufficiently high dielectric constant. Consequently, it is possible to manufacture, at a low cost, a dielectric element having a high dielectric constant of 900 or greater and a low leak current density of $1 \times 10^{-6}$ A/cm$^2$ or lower by using a material, which has a high conductivity and is inexpensive, but has a low oxidation temperature, for the upper electrode and the lower electrode.

The embodiments of the present invention are explained in detail as above. However, the present invention is not limited to the above-mentioned embodiments. The present invention can be modified in a variety of manners in a range without departing from its essentials.

The lower electrode 12 may be composed of not limited to Ni, but other metals such as Cu, Al, and Ag. Further, the lower electrode 12 may be an alloy of two or more metals.

The dielectric film 14 is not limited to BST. The dielectric may be an oxide and its preferable examples include a perovskite type oxide represented by a general chemical formula $ABO_3$. Examples of the perovskite type oxide include, in addition to BST, BT, that is, barium titanate $BaTiO_3$, strontium titanate $SrTiO_3$, $(BaSr)(TiZr)O_3$, and $BaTiZrO_3$. The dielectric may include one or more of these oxides.

The upper electrode 16 may be an alloy composed of two or more of Cu, Ni, Al, and Ag.

In the above-mentioned embodiments, a metallic foil is used as the lower electrode 12 and the metallic foil also serves as a substrate for supporting the dielectric film 14 and the upper electrode 16. Instead of this, it may also be possible to prepare a substrate separately from the lower electrode 12 and sequentially laminate the lower electrode, the dielectric film, and the upper electrode on the substrate. In this case, the substrate supports the lower electrode, the dielectric film, and the upper electrode.

According to the present invention, it is possible to manufacture a dielectric element using a material having a low oxidation temperature for an electrode and sufficiently reduce the leak current density of the dielectric element. As a result, it is possible to obtain a dielectric element having a high dielectric constant and a low leak current density.

What is claimed is:

1. A method for manufacturing a dielectric element, comprising:
    preparing a lower electrode;
    forming a dielectric film on the lower electrode to fabricate a first laminated structure;
    annealing the first laminated structure;
    forming an upper electrode of Ni on the dielectric film to fabricate a second laminated structure; and
    annealing the second laminated structure under a pressure of 133 Pa or lower at a temperature of from 150 to 450° C.

2. A method for manufacturing a dielectric element according to claim 1, wherein the dielectric film has a perovskite type structure and includes one or more of Ba, Sr, Ca, Pb, Ti, Zr, and Hf.

3. A method for manufacturing a dielectric element according to claim 1, wherein in the step of annealing the first laminated structure, the first laminated structure is annealed under a reduced pressure atmosphere, a reducing atmosphere, or a reduced pressure reducing atmosphere.

4. A method for manufacturing a dielectric element according to claim 3, wherein the lower electrode is composed of one or more of Cu, Ni, Al, and Ag.

5. A method for manufacturing a dielectric element according to claim 1, wherein the lower electrode is a metallic foil.

6. A method for manufacturing a dielectric element according to claim 1, wherein the dielectric film and the upper electrode of Ni is formed by a metal organic decomposition method.

7. A method for manufacturing a dielectric element according to claim 1, wherein the dielectric film and the upper electrode of Ni is formed by a sputtering method.

8. A method for manufacturing a dielectric element, comprising:
    preparing a lower electrode;
    forming a dielectric film on the lower electrode to fabricate a first laminated structure;
    annealing the first laminated structure;
    forming an upper electrode of Cu on the dielectric film to fabricate a second laminated structure; and
    annealing the second laminated structure under a pressure of 133 Pa or lower at a temperature of from 150 to 450° C.

9. A method for manufacturing a dielectric element according to claim 8, wherein the dielectric film has a perovskite type structure and includes one or more of Ba, Sr, Ca, Pb, Ti, Zr, and Hf.

10. A method for manufacturing a dielectric element according to claim 8, wherein in the step of annealing the first laminated structure, the first laminated structure is annealed under a reduced pressure atmosphere, a reducing atmosphere, or a reduced pressure reducing atmosphere.

11. A method for manufacturing a dielectric element according to claim 8, wherein the lower electrode is composed of one or more of Cu, Ni, Al, and Ag.

12. A method for manufacturing a dielectric element according to claim 8, wherein the lower electrode is a metallic foil.

13. A method for manufacturing a dielectric element according to claim 8, wherein the dielectric film and the upper electrode of Cu is formed by a metal organic decomposition method.

14. A method for manufacturing a dielectric element according to claim 8, wherein the dielectric film and the upper electrode of Cu is formed by a sputtering method.

* * * * *